(12) United States Patent
Kobrin

(10) Patent No.: US 10,249,520 B2
(45) Date of Patent: Apr. 2, 2019

(54) TRANSFER PRINTING USING ULTRASOUND

(71) Applicant: Boris Kobrin, Dublin, CA (US)

(72) Inventor: Boris Kobrin, Dublin, CA (US)

(73) Assignee: INNOVASONIC, Inc., Dublin, CA (US)

( * ) Notice: Subject to any disclaimer, the term of this patent is extended or adjusted under 35 U.S.C. 154(b) by 0 days.

(21) Appl. No.: 15/616,918

(22) Filed: Jun. 8, 2017

(65) Prior Publication Data

US 2018/0358246 A1 Dec. 13, 2018

(51) Int. Cl.
| | |
|---|---|
| H01L 21/67 | (2006.01) |
| H01L 23/00 | (2006.01) |
| H01L 21/683 | (2006.01) |
| H01L 33/62 | (2010.01) |
| H01L 33/00 | (2010.01) |
| H01L 21/68 | (2006.01) |
| B06B 1/06 | (2006.01) |

(52) U.S. Cl.
CPC ...... *H01L 21/67144* (2013.01); *H01L 21/681* (2013.01); *H01L 21/6835* (2013.01); *H01L 24/78* (2013.01); *H01L 24/83* (2013.01); *H01L 24/85* (2013.01); *H01L 24/92* (2013.01); *H01L 33/0079* (2013.01); *H01L 33/62* (2013.01); *B06B 1/0607* (2013.01); *H01L 2221/68363* (2013.01); *H01L 2221/68381* (2013.01); *H01L 2224/78347* (2013.01); *H01L 2224/83005* (2013.01); *H01L 2224/838* (2013.01); *H01L 2224/83205* (2013.01); *H01L 2224/83851* (2013.01); *H01L 2224/83874* (2013.01); *H01L 2224/85005* (2013.01); *H01L 2224/85205* (2013.01); *H01L 2224/92247* (2013.01); *H01L 2933/0066* (2013.01)

(58) Field of Classification Search
CPC . B41M 5/36; B41M 5/38221; H01L 51/0013; H01L 21/6835; H01L 2224/83874; H01L 2224/85005; H01L 2224/83005; H01L 2221/68363; H01L 2221/68381
See application file for complete search history.

(56) References Cited

U.S. PATENT DOCUMENTS

| | | | | |
|---|---|---|---|---|
| 5,798,779 A | * | 8/1998 | Nakayasu | B41J 2/0451 347/13 |
| 9,978,629 B1 | * | 5/2018 | Hsiang | H01L 21/6835 |
| 2007/0092982 A1 | * | 4/2007 | Nien | B06B 1/0292 438/50 |

\* cited by examiner

*Primary Examiner* — Sonya D. McCall-Shepard
(74) *Attorney, Agent, or Firm* — JDI Patent

(57) ABSTRACT

Embodiments of the invention pertain to methods useful in transfer printing of small objects, like micro-LEDs from one substrate to another using acoustic or ultrasonic energy. The pickup of objects from a substrate is performed by transfer head equipped with sticky polymer and an array of ultrasonic transducers, and the high efficiency and selectivity of pickup of selected objects is done using ultrasonic energy directed towards the object. The disposing of objects to another substrate from a transfer head is done by directing an ultrasonic energy toward an object, which enable effective and selective detachment of an object from a sticky polymer. Yet another embodiment also uses a UV light source, which directs the light to the UV curable liquid disposed around the object on receiving substrate, thus curing this liquid would attach an object to receiving substrate.

27 Claims, 4 Drawing Sheets

TRANSFER PRINTING USING ULTRASOUND

This application claims the benefit of U.S. provisional Application No. 62/348,124, filed Jun. 9, 2016

FIELD

Embodiments of the invention relate to method of transfer printing of small objects, for example, micro-scale light emitting diodes (u-LEDs), from one substrate to another.

BACKGROUND

This section describes background subject matter related to the disclosed embodiments of the present invention. There is no intention, either express or implied, that the background art discussed in this section legally constitutes prior art.

There is a need for high throughput assembly of small objects (semiconductor chips, LED chips, etc.) into a large area device (display, heterogeneous optoelectronic systems, biomedical devices, etc.). Incompatibility of substrate materials (for example, plastics) to fabrication technology of devices (for example, LED chips) requires the process of assembly some objects on a common device substrate of different origin.

Bible [U.S. Pat. No. 8,333,860] suggested an array of electrostatic MEMS heads for selective pick up and transfer objects on a receiving substrate. This technology required manufacturing transfer devices using MEMS technology. Transfer large amounts of microdevices (chips) onto a single device (display) requires higher than 99.99% yield of transfer, which is very problematic to achieve with a large array of MEMS electrostatic actuators.

Nuzzo [U.S. Pat. No. 7,943,491] suggested a method and system for such assembly based on elastomeric transfer device, which uses kinetically control adhesion to elastomeric surface to transfer objects from one substrate to another. In this patent application high separation rates are used to generate adhesion forces large enough to transfer objects from a donor substrate to elastomeric transfer device, and low separation rates have to be used in order to generate adhesion forces low enough to facilitate transfer of objects from transfer device to a receiver substrate. The difference in those rates could be as high as 100 times (100 mm/s rates for pickup objects from donor and 1 mm/s assembly rate to receiver). This inevitably puts an inherent limit on throughput of such system. Moreover, relying on just surface energy for proper transfer of a very large quantities of materials is problematic. Elastomeric material (for example, polydimethylsiloxane) is quite porous and can accumulate moisture, solvents and other vapors easily from the ambience or from an object in contact, which could change surface energy significantly. Also, exposure of elastomer (PDMS) to light (especially UV component) could change surface energy too. The content of PDMS is not usually uniform, having different molecular weight components moving to and from the surface over time and at different temperatures, which could change surface energy in a very unpredictable way. All above would inevitably impact the robustness of the process of pick-up and separation of objects and elastomeric transfer device. At the same time, the assembly process must delivery higher than 99% yield to be adopted in high volume low cost manufacturing process.

Here we suggest a new method for objects transfer and assembly, which does not rely only on surface energy of elastomeric material, but uses ultrasonic energy, and in some embodiments UV light, to facilitate separation of objects from elastomeric material and bonding them to a receiver substrate.

SUMMARY

Embodiments of the invention pertain to methods useful in transfer printing of small objects, like micro-LEDs from one substrate to another using acoustic or ultrasonic energy. The pickup of objects from a substrate is performed by transfer head equipped with sticky polymer and an array of ultrasonic transducers, and the high efficiency and selectivity of pickup of selected objects is done using ultrasonic energy directed towards the object. The disposing of objects to another substrate from a transfer head is done by directing an ultrasonic energy toward an object, which enable effective and selective detachment of an object from a sticky polymer. Yet another embodiment also uses a UV light source, which directs the light to the UV curable liquid disposed around the object on receiving substrate, thus curing this liquid would attach an object to receiving substrate.

Another embodiment use ultrasonic energy also to bond an object to the substrate during disposing by welding it to the contact pads or wire bonds.

Yet another embodiment also uses a UV light source, which directs the light to the UV curable liquid disposed around the object on receiving substrate, thus curing this liquid would attach an object to receiving substrate.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

Embodiments of the invention relate to methods useful in transfer printing of small objects, like micro-LEDs from one substrate to another using acoustic or ultrasonic energy. Usually, this process is performed using so called, transfer device, or transfer head. In prior art references separation of objects from elastomeric transfer device has to be slow, which slows down the entire assembly. Moreover, relying on just surface energy would not provide robust transfer process with a very high yield.

We suggest to employ ultrasonic energy to help controlling separation of objects of transfer from elastomer surface of transfer device, and also from adhesion layers of donor substrate. Such separation would happen due one or more of the following processes: vibration of the materials and mismatch of impedances between elastomer (soft polymer) and object (usually inorganic material), local heating of elastomer and object (or interface between them) by ultrasonic pulse, where thermal mismatch would cause separation. Additional possibility is to help such separation by bonding objects to receiver substrate after transfer using ultrasonic welding, wire bonding or UV curing adhesives. Transfer device could be a flat substrate (for batch, or step-and-repeat transfer) or cylindrical substrate (for continuous transfer).

Embodiment 1

Figure 1A:
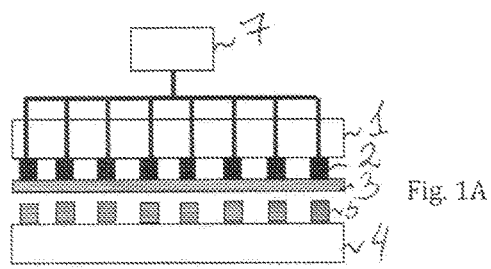
FIG. 1A, FIG. 1B, and FIG. 1C: Views describing the method of transferring an objects from a donor substrate onto a transfer device
Figure 1B:
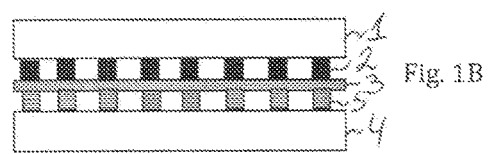
Figure 1C:
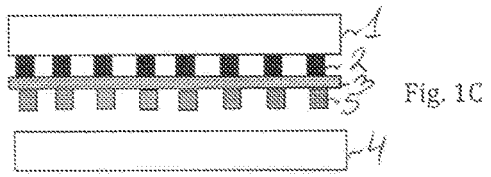
Figure 3A:
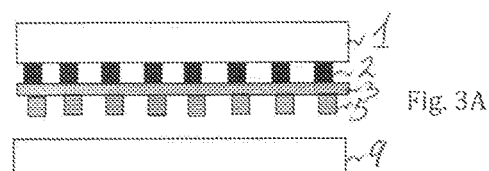
FIGS. 3A, 3B, and 3C: Views describing the method for transferring an objects from transfer device onto a receiver substrate.
Figure 3B:
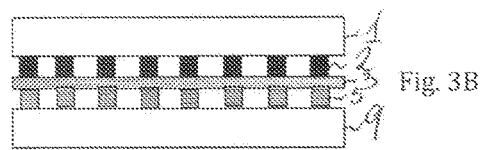
Figure 3C:
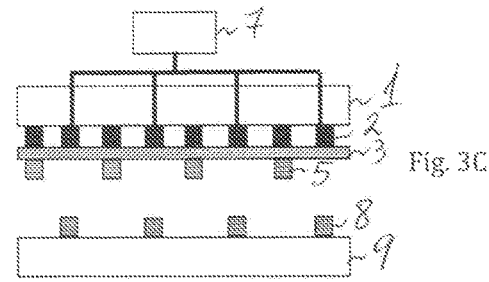
Figure 2A:
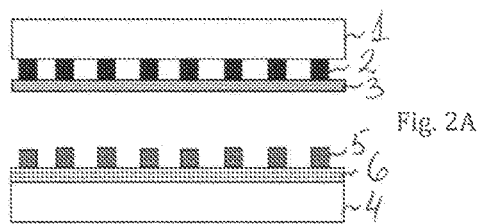
FIGS. 2A, 2B, and 2C: Views describing another embodiment for transferring an objects from a donor substrate onto a transfer device, which uses a sacrificial layer
Figure 2B:
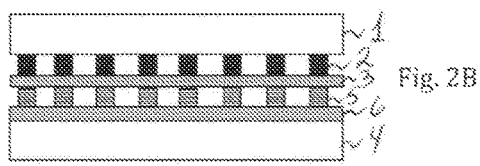
Figure 2C:
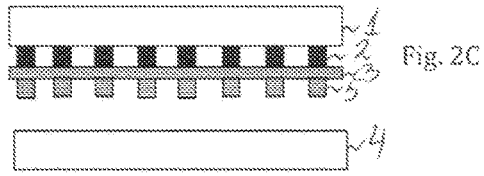

Transfer device is a flat substrate (1) with an array of ultrasonic transducers (2) fabricated on its surface, and connected to ultrasonic energy generator system (7), as shown on FIG. 1A. The number and placement of such transducers could be equal and similar to the placement of objects (for example, LED chips) on the final receiver device (for example, display). Alternatively, the number (and density) of objects could be much higher than on the final device. Elastomeric film (3) is deposited on the surface over ultrasonic transducers. It could be done in a few different ways: for example, thin elastomeric film (PDMS) could be attached to the glass substrate; alternatively, liquid PDMS material (2-component mixed precursors) could be deposited on substrate over transducers, and thermally cured. Such transfer device then is placed in conformal contact with the donor substrate (4), as shown on FIG. 1B. The donor substrate (1) has an array of objects (5), which either just sitting on the surface or attached to the surface with weak adhesive or breakable bridge material. Alternatively (FIG. 2A), objects (5) are attached to the donor substrate (4) through a sacrificial layer (6), for example thin layer of wax. This wax layer could be heated right before performing a contact with transfer device to release objects from the donor. In another option, wax could be heated just under the objects to be selectively released using a pulse of ultrasonic energy directed to the specific chip. The second part of the process is transfer objects from transfer device onto a receiver substrate. The transfer device (1) with objects (5) disposed on the surface of elastomer (FIG. 3A) is brought to conformal contact with a receiver substrate (9), as shown on FIGS. 3A,3B and 3C. An ultrasonic energy from the generator (7) is directed to the interface between elastomer and object, which would cause an object to be detached from elastomer and left on the receiver substrate, as shown on FIG. 3C, upon subsequent separation of transfer device and a receiver substrate. The ultrasonic energy could be directed selectively only to the objects to be transferred, as shown on FIG. 3C, so only few objects (8) are being transferred to the receiver substrate (9) by transfer device.

Embodiment 2

Figure 4A:
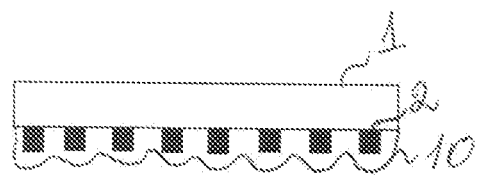
FIGS. 4A and 4B: Views describing use of elastomeric layers for concentration of acoustic energy (acoustic lens)
Figure 4B:
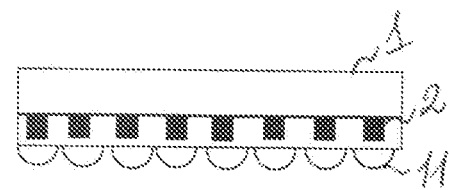

Elastomeric film (10) could be deposited over ultrasonic transducer array with the certain level of conformity to create curved surfaces over transducers (FIG. 4A); proper deposition techniques known in the art could achieve required curvature with a shape of lens to provide focusing of ultrasonic energy to the right spot. This could significantly enhance ultrasonic energy delivered to the right component or interface, and also save overall required power. In parallel, same technique of creating a stand-offs or dimples also helps to avoid contact between elastomeric material and areas of donor substrate free from transfer objects. This would reduce forces of separation of transfer device from donor substrate and reduce possible contamination. Similar result could be achieved by depositing liquid elastomer material on transfer device surface over transducer array and then casting it from a mold surface having a lens curvature (11) (FIG. 4B). The pattern of lens array should be aligned to ultrasonic transducers placement on transfer device.

Embodiment 3

Figure 5A:
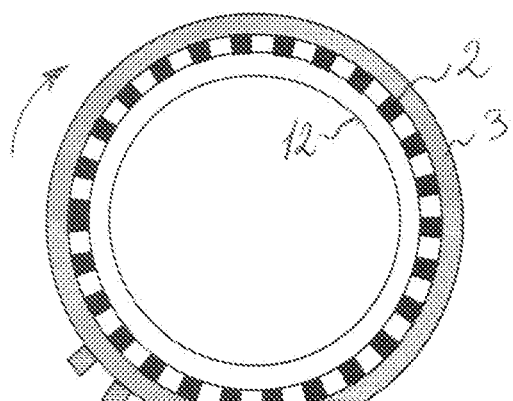
FIG. 5A and FIG. 5B: Views describing a method of transferring a feature per current patent in roll-to-plate configuration (continuous transfer printing), using cylindrically-shaped transfer device
Figure 5A:

Transfer device is a cylindrical substrate (12) with an array of ultrasonic transducers (2) fabricated on its surface (FIG. 5A). Elastomeric film (3) is deposited on the surface over ultrasonic transducers. It could be done in a few different ways: for example, thin elastomeric film (PDMS) could be attached to the glass substrate; alternatively, liquid PDMS material (2-component mixed precursors) could be deposited on substrate over transducers, and thermally cured. And yet, another alternative method is to fabricate an array of ultrasonic transducers on a thin sheet of flexible polymer or glass and then laminate it to the cylinder's surface.

Such transfer device then is placed in conformal contact with the donor substrate (4) having an array of objects (5), which either just sitting on the surface or attached to the surface with weak adhesive. The transfer device then starts to turn while the donor substrate starts to move laterally. This joint movement can be driven either by transfer device or donor substrate, and the moment is transferred through the contact between the two. Alternatively, both parts could be driven independently with necessary synchronization between them. During such movement, which is carried out with specific rate, objects are transferred from a donor substrate onto elastomeric film due to strong Wan-der-Vaals forces. Alternatively, ultrasonic energy can be directed from an array of transducers (2) onto the objects or interface between objects and donor substrate, which would enable more reliable and fats detachment of objects from the donor substrate. High speeds of transfer are possible (up to 1 m/s).

Alternatively, as per Embodiment 1, objects could be placed on donor substrate through some sacrificial layer (example, wax) and that layer adhesion force could be controlled (reduced) by temperature. For example, once wax is melted an object won't adhere to the donor substrate and can be picked up by transfer device. Another option is to melt sacrificial layer using ultrasonic pulse extended by ultrasonic transducers. This way only objects affected and released by sacrificial layer will be transferred.

Another option is to melt sacrificial layer using ultrasonic pulse extended by ultrasonic transducers. This way only objects affected and released by sacrificial layer will be transferred.

Figure 5B:
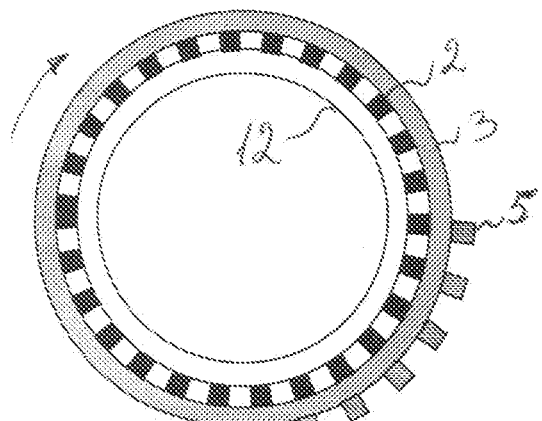

Subsequently, the cylindrical transfer device with objects disposed on the surface of elastomer is brought to conformal contact with a receiver substrate (9) and starts to turn, and receiving substrate starts to translate laterally, as shown on FIG. 5B. An ultrasonic energy is directed to the object, which would cause an object to be detached from elastomer and left on the receiver substrate. The ultrasonic energy could be directed selectively only to the objects to be transferred, as shown on FIG. 5B, when only every other device is being transferred.

The both processes above (transfer objects from donor substrate to transfer device and transfer objects from transfer device to receiver substrate) could be done on 2 separate tools or tracks, or on the same tool, where both, donor and receiver substrates are located side by side in sequence, and cylindrical transfer device makes one or more turns over donor substrate to pick up objects, and then one or more turns over receiver substrate to assemble them.

Embodiment 5

Figure 6A:
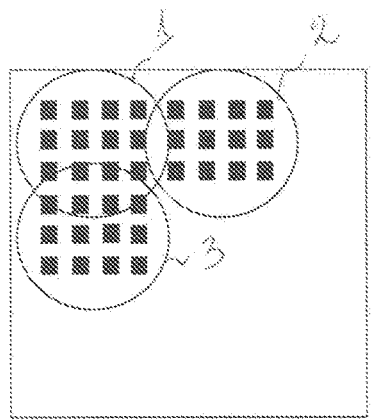
FIGS. 6A, 6B, and 6C: Views describing multiple donor and receiver substrates configurations (multiple-donor and/or multiple-receiver substrates with a single transfer device)

Transfer of objects from donor device onto transfer device can be done from one donor substrate one time or multiple times, or from multiple donors one or multiple times. Transfer objects from the same donor substrate or from multiple donor substrates onto different parts of transfer device is possible in step-and-repeat mode, as shown on FIG. 6A, where transfer 1 (13), transfer 2 (14) and transfer 3 (15) are performed sequentially, step by step.

Figure 6B:
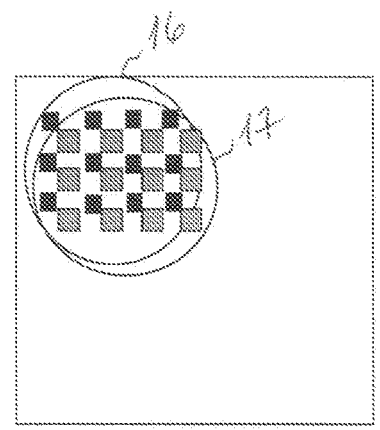
Figure 6C:
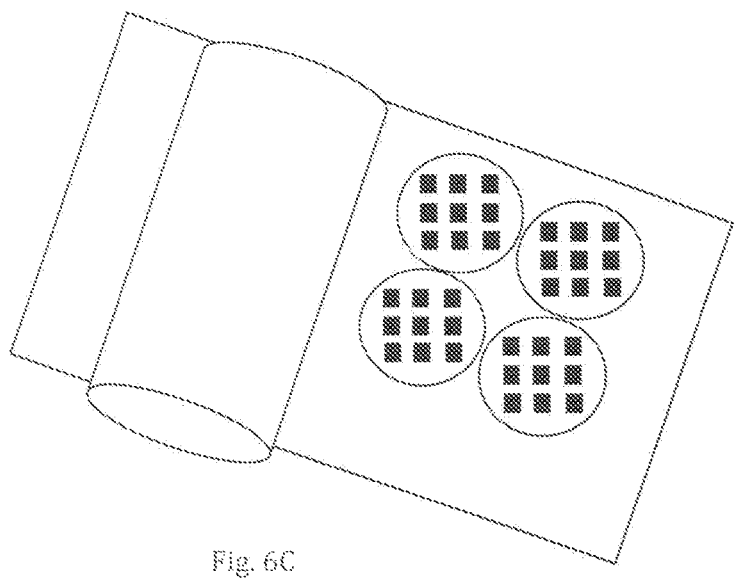

Alternatively, transfer an objects from the one or multiple donors to the same area of transfer device (with some shift in placement) can be done to increase efficient density of objects on transfer device (and subsequently on receiver substrate). And yet, another alternative is when transfer of different objects (16, 17) onto transfer device can be done from multiple donors (having different type of objects, for example LED chips having red-R, green-G and blue-B color emissions) in sequential mode with specific alignment onto the same area of transfer device, as shown on FIG. 6B, where 2 processes are performed sequentially on the same or overlapping areas of transfer device. Transfer similar or different objects from one or multiple donors onto the same or different parts of transfer device is possible in a single turn or multiple turns, and multiple passes of cylindrical transfer device over the chuck holding one or multiple donor substrates, as shown on FIG. 6C.

The same alternatives explained above exist in the process of transfer objects from transfer device onto receiver device. Objects could be transferred from a transfer device one or multiple times to the same or different receiver substrates depending on the goal and type of object devices.

Embodiment 6

Figure 7A:
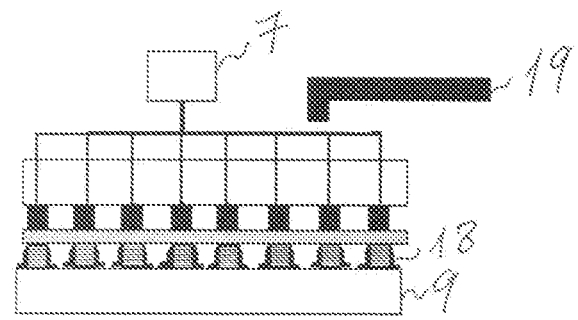
FIG. 7A, FIG. 7B and FIG. 7C: Views describing alignment and a system with ultrasonic-assisted welding or wire bonding and UV-curable conductive adhesive.

If an object is an electrical device or electro-optical device (for example, LED chip), and once it is transferred onto receiver substrate it would be very useful to connect it to the contact pads. Then the following embodiments provide the means for electrical connection of objects to the contact pads (18) prefabricated on receiver substrate (9), as shown on FIG. 7A. Once transfer device is aligned to contact pads pattern on receiver substrate using image recognition and alignment system (19) and brought in contact with the receiver substrate an ultrasonic pulse is delivered to the interface between object's metalized surface and contact pads to facilitate welding between them. The frequency and power of such ultrasonic energy emitted by ultrasonic transducers can be equal or different from the frequency and power of the pulse which facilitates separation of objects from transfer device.

Another embodiment uses prefabricated wires attached to objects, and during transfer device contact with the receiver substrate a pulse of ultrasonic energy is directed to the interface object's wire and contact pad to facilitate wire bond. The frequency and power of such ultrasonic energy emitted by ultrasonic transducers can be equal or different from the frequency and power of the pulse which facilitates separation of objects from transfer device.

The bonding process of objects by welding or wire bonding also helps to increase adhesion of an object to receiver substrate and facilitate separation of an object from transfer device in addition to (to increase separation speed and reliability of the process).

Embodiment 7

Figure 7B:
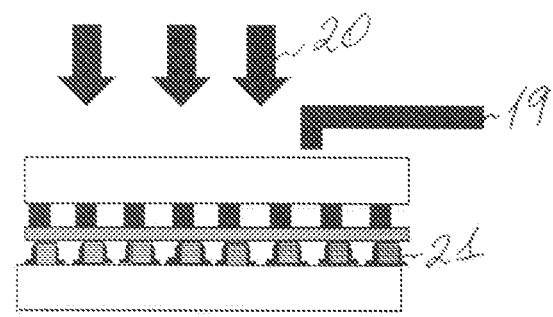
Figure 7C:
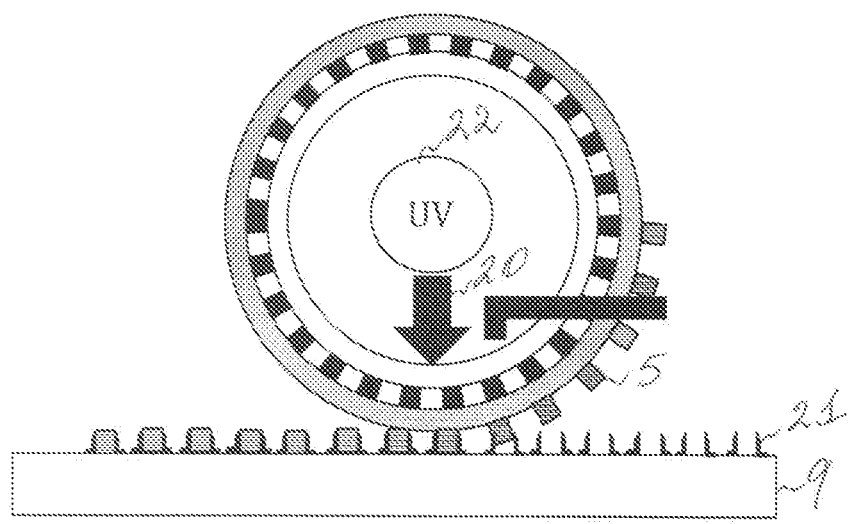

Another embodiment suggests providing a UV-curable conductive adhesive or ink (21) to be disposed onto contact pads on receiver substrate (9), as shown on FIG. 7B. Then transfer device is aligned to the contact pads on receiver substrate using image recognition and alignment system (19) and then UV light (20) is directed to the object area including related contact pads on receiver substrate. The UV light cures UV curable material (21) and fixes an object in electrical contact with contact pads. The bonding process of objects using UV curable conductive adhesive also helps to increase adhesion of an object to receiver substrate and facilitate separation of an object from transfer device in addition to (to increase separation speed and reliability of the process) or instead of using ultrasonic energy. The described process could be implemented as well in cylindrical transfer device configuration, as shown on FIG. 7C, where UV light source (22) shines the UV light (20) onto UV-curable conductive adhesive material (21) pre-deposited on the receiver substrate (9), which bonds the object (5) to the receiver substrate and provides electrical connection to the bondpad.

I claim:

1. A method of transferring an object from a donor substrate surface to a receiving substrate surface comprising:
    providing a transfer device having a one or more ultrasonic transducers and an elastomeric material disposed over said transducers;
    providing a donor substrate having a donor surface, said donor surface having at least one or more objects;
    contacting at least a portion of said transfer device with at least a portion of said donor substrate, said portion having an object;
    separating said transfer device from a donor surface at a separation rate required for transfer of said object from the donor substrate surface to the transfer device, thereby forming said transfer surface having said object deposited thereon;

contacting at least a portion of said object disposed on said transfer surface with said receiving surface of said receiving substrate, directing a pulse of ultrasonic energy from one or more ultrasonic transducers located in close vicinity of said object, and separating said transfer surface from said object, thereby transferring said object to said receiving substrate.

2. The method of claim 1 wherein said objects have lateral dimensions from 100 nm to 1000 microns and thickness from 10 nm to 1000 microns.

3. The method of claim 1 wherein said ultrasonic transducers are made of piezoelectric material and 2 electrode layers.

4. The method of claim 1 wherein said ultrasonic transducers are fabricated in the form of 2D-mesh of lines.

5. The method of claim 1 wherein said ultrasonic transducers are fabricated as an array of individual transducers assembled on the transfer device.

6. The method of claim 1 wherein said ultrasonic transducers are individually controlled.

7. The method of claim 1 wherein said pulse of ultrasonic energy is directed to all transducers to transfer all devices to receiving surface.

8. The method of claim 1 wherein said pulse of ultrasonic energy is directed to only selected transducers to transfer only selected set of objects to receiving substrate.

9. The method of claim 1 wherein rate of separation of transfer device from donor surface is in the range 1 mm/s to 1 m/s.

10. The method of claim 1 wherein said object is supported by adhesive or sacrificial layer.

11. The method of claim 10 wherein said adhesion or sacrificial layer can change adhesion to said objects caused by ultrasonic energy directed towards the object, interface or layer itself.

12. The method of claim 11 wherein the sacrificial layer is wax and it can melt upon absorption of ultrasonic energy.

13. The method of claim 1 wherein said object is connected to said donor surface by one or more bridge elements, which is fractured upon ultrasonic actuation.

14. The method of claim 1 wherein said elastomeric material is deposited over said transducers so to create lens-like shape over transducer objects for focusing acoustic signal.

15. The method of claim 1 wherein said elastomeric material is casted over said transducers using mold having a concave lens structures for focusing acoustic energy.

16. The method of claim 1 wherein said transfer device is a flat mold, on which said transducers and elastomeric material are fabricated, and wherein said flat mold is contacting an object on donor or receiver substrate by moving said substrate toward flat mold or moving flat mold towards said substrate.

17. The method of claim 1 wherein said transfer device is a cylindrical mold, on which said transducers and elastomeric material are fabricated.

18. The method of claim 17 wherein said cylindrical mold is contacting an object on a donor or receiver substrate by rolling on said object, and wherein said cylindrical mold is separating from an object on a donor or receiver substrate by rolling from said object.

19. The method of claim 1 wherein said transfer device could contact more than one donor substrate to transfer objects from donor substrate onto the transfer device surface in step-and-repeat mode on different areas of transfer device.

20. The method of claim 1 wherein said transfer device could contact the same donor multiple times and transfer objects from donor substrate to the same area of transfer device to increase density of objects on transfer device.

21. The method of claim 1 wherein said transfer device could contact more than one receiver substrate to transfer objects to multiple receiver substrates.

22. The method of claim 1 wherein said transfer device could contact receiver substrate multiple times in order to increase density of objects on the receiver substrate.

23. The method of claim 1 wherein said transducers are aligned to objects on the donor substrate using optical image recognition system and translation mechanism of the transfer device or donor substrate.

24. The method of claim 1 wherein said objects have metallized contact pads and receiver substrate has contact pads fabricated on the surface for electrically connecting to said objects, and after object is transferred to receiver substrate ultrasonic energy is directed from said transducers onto object and receiver contact pads being in contact to perform ultrasonic welding.

25. The method of claim 1 wherein said object has attached wires and receiver substrate has contact pads fabricated on the surface for electrically connecting to said objects, and after object is transferred to receiver substrate ultrasonic energy is directed from said transducers onto the interface between contact pads and object wires being in contact to perform wire bonding.

26. A method of transferring an object from a transfer device surface to a receiving substrate surface, comprising:
providing a transparent to UV light transfer device, an elastomeric material disposed over said transfer device and one or more objects attached to said transfer device;
aligning said transfer device to a receiver substrate such that said one or more objects are aligned to contact pads fabricated on said receiver substrate and coated with UV curable conductive adhesive;
contacting at least one of said one or more objects disposed on said transfer device with a receiving surface of said receiving substrate; and
directing a UV light through said transfer device to cure said adhesive, and separating said transfer surface from said object of said one or more objects, thereby transferring said object to said receiving substrate, and also electrically connecting said object of one or more objects to said contact pad.

27. A method of transferring an object from a donor substrate surface to a receiving substrate surface comprising:
providing a transparent to UV light transfer device having a one or more ultrasonic transducers and an elastomeric material disposed over said transducers;
providing a donor substrate having a donor surface, said donor surface having one or more objects thereon:
contacting at least a portion of said transfer device with at least a portion of said donor substrate, said portion having an object of said one or more objects thereon:
separating said transfer device from said donor surface at separation rate required for transfer of said object of said one or more objects from the donor substrate surface to said transfer device, thereby forming
a transfer surface having said object of said one or more objects thereon;
aligning said transfer device to said receiver substrate such that said one or more objects are aligned to contact pads fabricated on said receiver substrate and coated with UV curable conductive adhesive;

contacting at least portion of said object of said one or more objects disposed on said transfer surface with said receiving surface of said receiving substrate, directing a UV light through said transfer device to cure said adhesive, and ultrasonic pulse energy from said transducers to separate said transfer surface from said object, thereby transferring said object of said one or more objects to said receiving substrate, and also electrically connect said object of said one or more object to said contact pad.

* * * * *